United States Patent
Stewart (10) Patent No.: US 10,241,717 B2
(45) Date of Patent: Mar. 26, 2019

(54) MEMORY BOOSTING

(71) Applicant: QUALCOMM TECHNOLOGIES INTERNATIONAL, LTD., Cambridge (GB)

(72) Inventor: Neil Stewart, Cambridge (GB)

(73) Assignee: Qualcomm Technologies International, Ltd., Cambridge (GB)

( * ) Notice: Subject to any disclaimer, the term of this patent is extended or adjusted under 35 U.S.C. 154(b) by 365 days.

(21) Appl. No.: 14/143,162

(22) Filed: Dec. 30, 2013

(65) Prior Publication Data

US 2015/0186071 A1 Jul. 2, 2015

(51) Int. Cl.
| | |
|---|---|
| G06F 9/45 | (2006.01) |
| G06F 12/08 | (2016.01) |
| G06F 12/0808 | (2016.01) |
| G06F 12/0815 | (2016.01) |
| G06F 3/06 | (2006.01) |
| G11C 7/04 | (2006.01) |
| G11C 16/34 | (2006.01) |

(52) U.S. Cl.
CPC .......... *G06F 3/0653* (2013.01); *G06F 3/0625* (2013.01); *G06F 3/0679* (2013.01); *G11C 7/04* (2013.01); *G11C 16/3418* (2013.01); *G11C 16/3495* (2013.01)

(58) Field of Classification Search
CPC ...... G06F 1/3287; G06F 1/3203; G06F 1/324; G06F 2009/45595; G06F 8/61; G06F 9/4408; G06F 9/4416; G06F 9/45533
USPC .......................................................... 711/156
See application file for complete search history.

(56) References Cited

U.S. PATENT DOCUMENTS

| | | | | |
|---|---|---|---|---|
| 7,347,621 | B2* | 3/2008 | Sri-Jayantha | G06F 1/206 374/111 |
| 7,584,465 | B1* | 9/2009 | Koh | G06F 8/34 717/109 |
| 7,622,896 | B2* | 11/2009 | Nakagawa | H02J 7/047 320/150 |
| 8,122,187 | B2* | 2/2012 | Walker | G11C 11/406 711/106 |

(Continued)

FOREIGN PATENT DOCUMENTS

| | | |
|---|---|---|
| WO | WO 2006/014315 | 2/2006 |
| WO | 2010054670 A1 | 5/2010 |

(Continued)

OTHER PUBLICATIONS

David Shuman, Dynamic Clock Calibration via Temperature Measurement, Dec. 2009, IEEE conference on Decision and control.*

(Continued)

*Primary Examiner* — Mohamed M Gebril
(74) *Attorney, Agent, or Firm* — Procopio, Cory, Hargreaves & Savitch LLP (57) ABSTRACT

A data processing device including a processor and a memory interface, the processor being configured to control the refreshing of a memory by the steps of: periodically forming an estimate of a current rate of decay of a memory and updating an accumulated level of decay of the memory in dependence on the estimated current rate of decay; and causing the memory interface to refresh the memory when the accumulated level of decay exceeds a predetermined threshold. The estimate may be based on a measurement of ambient temperature.

19 Claims, 4 Drawing Sheets

(56) References Cited

U.S. PATENT DOCUMENTS

| | | | |
|---|---|---|---|
| 9,269,201 B2* | 2/2016 | Kochie | B60C 23/0408 |
| 2002/0021599 A1 | 2/2002 | Peter | |
| 2002/0169924 A1 | 11/2002 | Osborn | |
| 2004/0044450 A1 | 3/2004 | Taguchi et al. | |
| 2006/0010264 A1* | 1/2006 | Rader | B65H 35/0013 |
| | | | 710/23 |
| 2006/0280012 A1* | 12/2006 | Perner | G11C 7/04 |
| | | | 365/212 |
| 2007/0258306 A1* | 11/2007 | Riekels | G11C 7/1051 |
| | | | 365/222 |
| 2007/0274147 A1 | 11/2007 | Egerer | |
| 2009/0238239 A1 | 9/2009 | Pan | |
| 2010/0117829 A1 | 5/2010 | Mayer et al. | |
| 2010/0142291 A1 | 6/2010 | Joo et al. | |
| 2013/0188429 A1* | 7/2013 | Huang | G11C 11/40615 |
| | | | 365/189.07 |
| 2014/0281311 A1* | 9/2014 | Walker | G06F 3/0631 |
| | | | 711/162 |
| 2014/0310445 A1* | 10/2014 | Fitzpatrick | G11C 16/20 |
| | | | 711/103 |

FOREIGN PATENT DOCUMENTS

| | | |
|---|---|---|
| WO | WO 2010/076828 | 7/2010 |
| WO | WO 2012/167357 | 12/2012 |

OTHER PUBLICATIONS

GB Search Report issued in related GB Application No. 1414015.6, dated Feb. 2, 2015.

* cited by examiner

MEMORY BOOSTING

BACKGROUND

This invention relates to improving the retention of memory in a manner that may be power-efficient.

Many data processing applications make use of non-volatile or volatile memory storage, for example in the form of flash memory, DRAM (dynamic random access memory) or SRAM (static random access memory). In some types of memory energy must continually be supplied to the memory in order for it to maintain its state. In contrast, in non-volatile memory data can be stored when no power is applied. This makes non-volatile memory attractive for low-power applications. However, non-volatile memory can decay over time, resulting in the data it stores being unreliable. For example, in flash memory, data is stored through a remnant charge on a floating gate of a transistor. At room temperature that charge can be stable for many years. However, at elevated temperatures factors such as electron mobility are increased and so the rate of memory decay is greater than at room temperature. Hence, at higher temperatures the stored charge in a flash memory and in other types of reprogrammable non-volatile memory can leak. If the charge is not topped up from time to time the memory will lose its state.

In most consumer electronics applications devices are expected to be used in a relatively narrow band of temperatures around room temperature: for example from 0° C. to 40° C. However, in automotive applications and in some industrial and military applications a much wider range of operating temperatures is demanded. For example, some automotive manufacturers require that products operate reliably up to 105° C.

Figure 1:
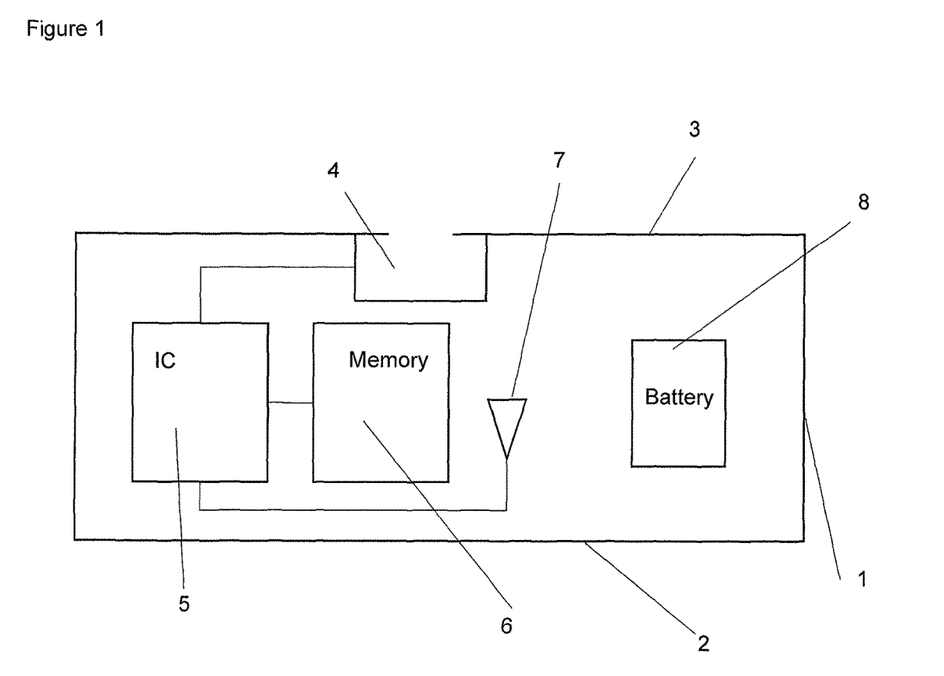
FIG. 1 illustrates a conventional tyre pressure monitor.

It is desirable to be able to use a general-purpose electronics product even in applications that call for a wide range of operating temperatures. A specialised high-temperature product is likely to be manufactured in lower volumes and therefore to be more expensive. FIG. 1 illustrates one scenario. FIG. 1 shows a wireless tyre pressure monitor. The tyre pressure monitor comprises a housing 1. The housing has a base 2 which can attach to a wheel rim with the opposite face 3 being exposed to the volume inside a tyre. A pressure sensor 4 is mounted in face 3. Inside the housing is a processing and communications integrated circuit (IC) 5 and a flash memory 6. The IC 5 is connected to an antenna 7 for transmitting and receiving radio signals and to a battery 8 which powers the device. In operation the IC 5 takes pressure measurements from the sensor 4 and transmits them to a receiver in the body of a vehicle. The memory 6 stores information such as communication parameters for the IC's interface to the vehicle. The IC could be used in many other applications, and by using a multi-purpose IC in this device the cost of the tyre pressure monitor can be reduced. With this in mind, in order to permit the tyre pressure monitor to operate up to, for example 105° C., a conventional approach is to use a multi-purpose IC and to select for the memory 6 a special flash memory device that has a low rate of decay at high temperatures. However, this causes other difficulties. First, such memory devices are more expensive than normal consumer-level memory devices. Second, they can require more energy than consumer-level memory devices for writing and reading. This is especially significant for a device such as a tyre pressure monitor because its battery cannot easily be changed.

Some memory devices provide the ability to measure the remaining retention margin, for example by varying the supply voltage. With such devices it would be possible to periodically measure the margin and refresh the contents when there is little margin left. This approach has two disadvantages. First, energy must be regularly expended in polling the device. Second, in environments where the temperature fluctuates the relationship between net margin loss and temperature may be difficult to estimate, meaning that the effective margin for a given device is difficult to establish based on a knowledge of reported retention margin and temperature.

There is a need for an improved way of providing memory that is tolerant of elevated temperatures, especially in very low power devices.

SUMMARY OF THE INVENTION

According to one aspect of the present invention there is provided a data processing device comprising a processor and a memory interface, the processor being configured to control the refreshing of a memory by the steps of: periodically forming an estimate of a current rate of decay of a memory and updating an accumulated level of decay of the memory in dependence on the estimated current rate of decay; and causing the memory interface to refresh the memory when the accumulated level of decay exceeds a predetermined threshold.

The processor may be configured to form the estimate of a current rate of decay of the memory in dependence on a sensed ambient temperature.

The processor may be defined on an integrated circuit substrate. The data processing device may comprises a temperature sensor on the same integrated circuit substrate. The processor may be configured to form the estimate of a current rate of decay of the memory in dependence on a temperature sensed by that temperature sensor. Alternatively, it may be configured to form the estimate of a current rate of decay of the memory in dependence on a temperature sensed by a temperature sensor that is not on the integrated circuit substrate. The integrated circuit substrate may be a semiconductor substrate.

The data processing device may be configured to sense temperature by the steps of: turning on power to the temperature sensor, deriving a value representative of ambient temperature from the temperature sensor, and turning the temperature sensor off.

The temperature sensor may include an analogue to digital converter for forming a digital representation of ambient temperature.

The data processing device may comprise a data store storing data defining a model of the rate of decay of the memory as a function of temperature. The processor may be configured to form the estimate of a current rate of decay of the memory by means of the model.

The data processing device may comprise a data store storing data defining models of the rate of decay of a plurality of types of memory as a function of temperature. The processor may be configured to form the estimate of a current rate of decay of the memory by means of one of the models that corresponds to the said memory.

The processor may be configured to sense ambient temperature and form the estimate of a current rate of decay of the memory in dependence thereon at no less than a predetermined frequency and to update the accumulated level of decay of the memory in dependence each such estimated current rate of decay.

The data processing device may be capable of performing a communications function that involves forming an estimate of ambient temperature. That may be a radio communication function, such as transmitting and/or receiving wireless radio frequency signals. The processor may be configured to form an estimate of a current rate of decay of a memory in dependence on the temperature as sensed for the communications function and to update the accumulated level of decay of the memory in dependence on that estimated current rate of decay.

The memory interface may be configured to refresh the memory by replenishing one or more charge storage devices in the memory whose charge states define the data stored in the memory.

The memory may be a non-volatile reprogrammable memory.

The device may be configured to store the accumulated level of decay of the memory.

The data processing device may be configured to execute a program routine whose function is a function other than memory management, that program routine causing the processing device to sense and store an estimate of ambient temperature, and to forming the estimate of a current rate of decay of a memory in dependence on that stored estimate of ambient temperature.

According to a second aspect of the present invention there is provided an environmental sensing device comprising: a data processing device as claimed in any preceding claim, the data processing device comprising a wireless transceiver; the memory; an environmental sensor for sensing a parameter other than temperature; and a battery for powering the sensing device.

The data processing device, the memory and the battery may be sealed within a housing. The battery may be non-replaceable and/or non-rechargeable without irreparably damaging the housing.

According to a third aspect of the invention there is provided a road-going vehicle comprising a data processing device or an environmental sensing device as set out above.

According to a fourth aspect of the invention there is provided a method for controlling the refreshing of a memory, the method comprising the steps of: periodically forming an estimate of a current rate of decay of the memory and updating an accumulated level of decay of the memory in dependence on the estimated current rate of decay; and causing the memory interface to refresh the memory when the accumulated level of decay exceeds a predetermined threshold.

BRIEF DESCRIPTION OF THE DRAWINGS

The present invention will now be described by way of example with reference to the accompanying drawings. In the drawings.

DETAILED DESCRIPTION

Figure 2:
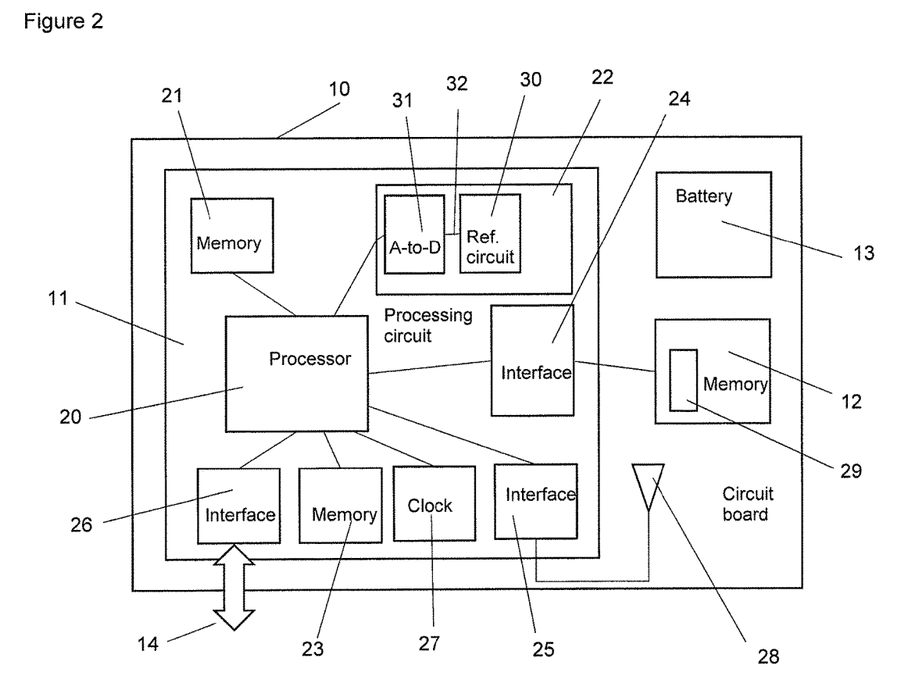
FIG. 2 illustrates a device having a processing circuit and a memory.

FIG. 2 shows a circuit board 10 carrying a processing circuit 11 and a non-volatile memory 12. In the device of FIG. 2 the processing circuit is arranged to sense ambient temperature from time to time. In dependence on the sensed temperature it accumulates a value that represents the decay of state of memory 12. When that decay reaches a predetermined threshold it refreshes the memory 12. This approach avoids the need to use a dedicated high-temperature memory, or to refresh the memory excessively often at lower temperatures.

In more detail, FIG. 2 shows a device constituted on a circuit board 10. The device comprises the processing circuit 11, the memory 12 and a battery 13 which powers the system. The processing circuit has an interface 14 for communication with other devices. The device shown in FIG. 2 could be a module that can be used in the manufacture of a range of consumer, automotive and industrial devices. For example it could be paired with a pressure sensor and a suitable housing to form a tyre pressure monitor of the type illustrated in FIG. 1.

The processing circuit 11 is formed as an integrated circuit on a single semiconductor substrate. In this example the memory 12 is formed on a separate semiconductor substrate, but the two could share a single semiconductor substrate.

The processing circuit comprises a central processor 20. The central processor could be a general purpose microprocessor or it could be a dedicated hardware state machine. In the case of the central processor being a microprocessor the processing circuit comprises a read only memory (ROM) 21 which stores program instructions for execution by the microprocessor in order for it to carry out its function. The ROM stores the instructions in non-transitory form. The central processor 20 is connected to a temperature sensing block 22, a local read/write memory block 23, a memory interface 24, data interfaces 25, 26 and a clock 27. The processing circuit 11 is coupled to the memory 12 via the memory interface 24. Data interface 26 links the central processor to interface 14. Data interface 25 is a radio transceiver which is coupled to an antenna 28 on the circuit board.

The temperature sensing block 22 comprises a bandgap temperature reference circuit 30 and an analogue to digital converter 31. The bandgap temperature reference circuit provides an output at 32 that is related to the base-emitter voltage ($V_{BE}$) of a transistor. That voltage is temperature dependent. In the illustrated example circuit, the output at 32 is linearly related to temperature for normal operating temperatures. The bandgap reference circuit could be a Brokaw bandgap reference circuit. The bandgap reference circuit could be replaced by any other suitable means of measuring temperature, such as diode-based temperature sensing circuits, thermistors and thermocouples. When the temperature sensing block is operational the voltage at 32 is converted to a digital word by analogue to digital converter 31. That digital value is passed to the central processor 20. The temperature sensing circuitry could be external to the integrated circuit 11 and could be off the circuit board 10.

In this example, the module is designed to be highly energy efficient. To that end the central processor 20 can power down parts of the processing circuit 11 when they are not required. For example, the central processor can independently control the power to the temperature sensing block 22, the memory block 23 and the interfaces 24, 25, 26 so that they can each be placed in a quiescent or even a zero power mode independently of the others. The central processor operates according to a predetermined scheme defined by its state machine algorithm or by instructions stored in ROM 21 defining an operational algorithm, according to which it powers the peripheral units 22, 24, 25, 26 on and off as they are required. The progress of the algorithm is governed by clock pulses from clock 27. At a time when only temperature sensing is required, the processor could power on only the temperature sensing block, whilst any one or more other blocks are not powered. This provides an efficient mechanism to sense temperature when the chip is otherwise quiescent.

Figure 3:
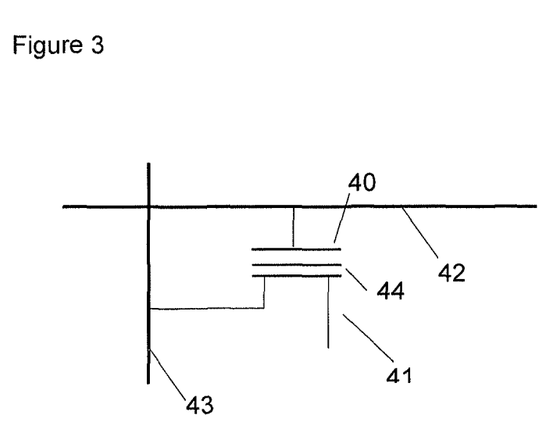
FIG. 3 shows a flash memory cell.

In this example the memory 12 is a flash memory, but it could take other forms. Conveniently it is memory of a type that is capable of holding a state with no applied power, but whose state decays over time. The rate of that decay may be temperature-dependent. FIG. 3 illustrates a single bit storage cell in memory 12. The cell comprises a transistor 40 which can be accessed by a word line 42 and a bit line 43. The word line 42 is used to address the cell. The bit line 43 is used to designate the value to be written to the cell, or to read the value stored in the cell. To write the cell the bit line is set high or low according to the value to be written and the word line is set high and then low. This stores a charge on, or discharges, a floating gate 44 of the transistor 40. The state of the floating gate determines whether the transistor will conduct when the word line is set to an intermediate level. To read the cell a sense line 41 is set to a known level, say high, and the word line is set to the intermediate level. The level of the bit line is then sensed. If the bit line is connected to the sense line that indicates a charge is present on the floating gate 44 and that the cell is in one state, say logical "1". If the bit line is not connected to the sense line that indicates little or no charge is present on the floating gate 44 and that the cell is in the other state, say logical "0". It is the progressive loss of charge from floating gate 44 over time that causes the state of the cell to decay.

The memory interface 24 permits the central processor to write to and read from memory 12. To write to the memory 12 the memory interface 24 identifies a cell in the memory and causes either a charge to be stored there (e.g. to indicate a logical "1") or any charge stored there to be depleted (e.g. to indicate a logical "0"). To read from the memory 12 the memory interface 24 identifies a cell in the memory and determines its state. The memory 12 itself may contain driver circuitry 29 which handles the addressing, charging/discharging and reading of the cells. The memory interface can refresh a cell in the memory by reading the cell's state and then writing that same state back to the same cell. Alternatively, the memory 12 may be responsive to a specific refresh signal to cause the local memory driver 29 to autonomously refresh the memory cells.

The memory 23 could be constituted by DRAM, SRAM, flash or any other suitable type of memory. It can store at least a value $D_A$ representing an accumulated level of decay. That value may, for example, be a 16-bit word. Memory 23 may also store a time of a previous measurement, as will be described below.

Figure 4:
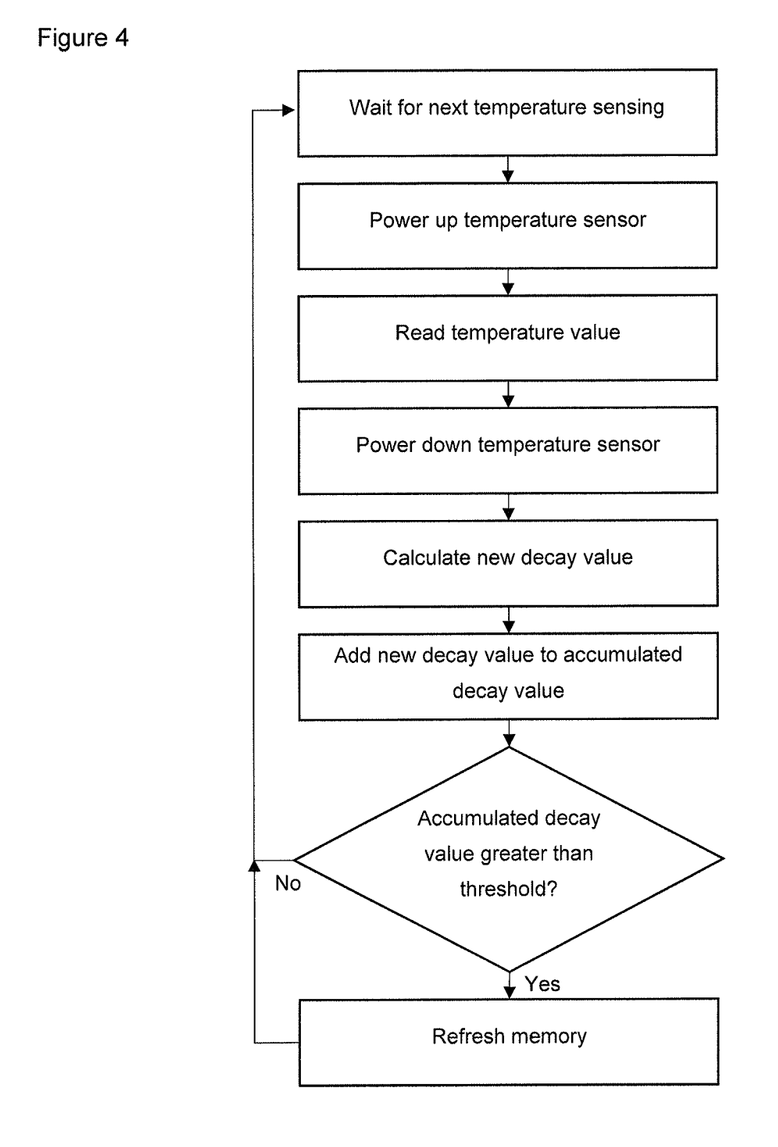
FIG. 4 shows a process for refreshing a memory.

The operation of the central processor 20 to maintain the memory 12 will now be described. This operation may be programmed into the central processor through an algorithm defined by executable instructions in memory 21 and/or as a hardware state algorithm. The algorithm progresses in accordance with pulses from the clock 27. The algorithm is illustrated in FIG. 4. From time to time the clock reaches a state where a temperature sensing operation is triggered. This may happen at constant intervals. Alternatively the interval between temperature measurements may be dependent on the last-sensed temperature value, with the interval being less if the last-sensed temperature was higher. The interval may be dependent on other factors such as other activities the processor 20 has to perform. For example, the processor could cause the measurement to take place at a time during, or immediately before or after, other operations that require the processor to be active. Conveniently the interval between temperature sensing events for the purposes described herein could be in the range from 10 minutes to 30 hours. The interval could be outside that range. A suitable interval will depend on the environment that a device is expected to be exposed to, and the period over which its ambient temperature might be expected to vary. To determine when to take a measurement the current clock value could be compared to the time of a previous measurement as stored in memory 23 and if the difference between the two exceeds a predefined threshold interval then a temperature measurement may be triggered.

The processor may be configured to take temperature measurements for another purpose, such as maintaining radio calibration state. In that case the temperature estimates formed for that purpose could be used to assist in estimating the state of the memory. The temperature readings taken for that other purpose may be taken at intervals significantly less than are relevant for estimating the state of the memory. In that case the temperature readings could be averaged, or a subset of the readings selected for use in estimating memory state. If the temperature is found to change by more than a preset threshold since the last reading, or within a preset time or number of successive readings, the minimum time between temperature readings may be reduced. If the temperature is found to change by less than a preset threshold since the last reading, or within a preset time or number of successive readings, the maximum time between temperature readings may be increased.

For most of the time the temperature sensing block 22 may be powered down to reduce energy consumption. On reaching the point at which temperature is to be sensed the block is powered up, and the central processor receives a digitised value representing the current temperature. Then the temperature sensing block is powered down again.

The rate of decay of memory 12 for a range of temperatures is known. Typically, it will be specified by the manufacturer of the memory. The rate of decay can be expressed as a time $t_D$ that will be taken for the memory to reach a standard level of decay, with $t_D$ being a function of temperature. The appropriate standard level of decay will depend on the level of error correction available and the use to which the memory is being put, but it could, for example be the level at which the probability of a particular cell having lost sufficient charge to have become unreliable is $1/10^9$. Alternatively, the memory may be such that it can be read in a normal manner or, in a second manner that uses more energy but can successfully resolve stored data at a greater level of decay than the normal manner. Then the memory may be refreshed when it reaches a level of decay that indicates it is unreliable to be read in the normal manner. The central processor has access to data defining a model of $t_D$ as a function of temperature, so that for a given temperature the central processor can compute the corresponding $t_D$. The central processor may store models of $t_D$ as a function of temperature for a range of different memory devices. Then the central processor can detect the type of memory 12, or can be programmed when the device is built so as to store data indicating the type of the memory 12, and can compute $t_D$ using the appropriate model.

Once the central processor receives a digitised value representing the current temperature it computes $t_D$ for that temperature. The central processor also knows the time $t_M$ since the previous temperature measurement. It may know that because the measurements are taken at fixed intervals, so $t_M$ is constant. Alternatively, it may store the time of each measurement in memory 23 and calculate $t_M$ as the difference between the current time and the time of the previous measurement. The central processor then calculates a value $D_N$ representing an estimate of new decay since the previous measurement. $D_N$ represents the current rate of decay of the memory. $D_N$ may be calculated as $t_M/t_D$. Then the accumulated delay is updated by setting the stored value $D_A$ to equal the previous value of $D_A$ plus $D_N$.

The central processor stores a decay threshold, at which the memory is to be refreshed. In the example described above, the decay threshold could be 1 if the memory is to be refreshed at the standard level of decay. Alternatively, the threshold could be above or below the standard level. If the current value of $D_A$ exceeds the decay threshold then the central processor causes the memory interface 24 to refresh the memory. The objective is to refresh the memory before the decay in any cell in the memory device has exceeded a level that can be recovered by normal read or error-correcting read mechanisms.

Refreshing the memory involves consuming energy from the battery 13 in order to top up the charge on the appropriate ones of the floating gates in the memory. The method described above allows that energy consumption to be reduced compared to at least some other methods.

This approach has a number of advantages. First, because the temperature is measured at discrete intervals, rather than continuously the temperature sensor can be powered down for much of the time. Although taking temperature measurements periodically reduces the accuracy of the accumulated decay $D_A$, which might lead to the memory being refreshed more often than necessary, this can be offset by the power savings derived through powering down the temperature sensor. It also saves energy as there is no need to directly measure the decay rate of the individual memory cells in the device, which may require significantly more energy than simply taking periodic temperature measurements. Second, the refreshing of the memory 12 can be customised to the type of the memory and the temperature in the environment of the device. This means that the lifetime of the device on a single battery can be increased compared to devices that simply refresh the memory at fixed intervals, especially for devices that mainly experience cool temperatures. Third, the device can be acceptable to manufacturers who require tolerance of high temperatures without excessively compromising cost or performance for customers who use devices only at lower temperatures. Although manufacturers might want products to operate up to 105° C., in many applications the vast majority of products will experience such temperatures very rarely if ever. Fourth, the device can meet high temperature specifications without the need for either a memory or a processor that is specific to high-temperatures. This can reduce cost.

The central processor may perform other functions. For example, it could sense data through interface 14 and transmit that data wirelessly using interface 25. Some of those functions may require the central processor to take a temperature measurement. When that happens the central processor can set $D_A=D_A+t_M/t_D$, and update the stored time of last measurement. This could then delay the time at which the next measurement will be required, further saving power.

Clock 27 may itself be sensitive to temperature. To cope with this the clock could be temperature-compensated, or the values from the clock could be adjusted based on currently or recently sensed temperature(s). Alternatively, the threshold decay level could be set low enough that temperature sensitivity of the clock will not be expected to cause the memory to be refreshed too late.

The method described above could be applied to memory other than flash memory. It could be used to determine when to top up other types of memory such as magnetic memory and DRAM.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A data processing device comprising:
  a processor and a memory interface, the processor being formed on an integrated circuit substrate;
  a temperature sensor formed on the integrated circuit substrate;
  a clock connected to the processor;
  the processor being configured to control refreshing of a non-volatile memory by the steps of:
    forming an estimate of a current rate of decay of the non-volatile memory in dependence on a current temperature sensed by the temperature sensor;
    determine an amount of decay based on the estimated current rate of decay and an adjusted interval of time between triggering the temperature sensing of the current temperature and triggering a temperature sensing of a previous temperature;
    updating an accumulated level of decay of the non-volatile memory in dependence on the estimated current rate of decay, wherein updating the accumulated level of decay comprises adding the determined amount of decay to a previous accumulated level of decay; and
    causing the memory interface to refresh the non-volatile memory by replenishing one or more charge storage devices in the non-volatile memory when the accumulated level of decay exceeds a predetermined threshold,
  wherein the data processing device is configured to sense the current temperature by the steps of:
    triggering a temperature sensing of the current temperature when a state of the clock reaches an adjusted initial interval of time,
    subsequent to said triggering the temperature sensing, turning on power to the temperature sensor,
    deriving a value representative of the current temperature sensed by the temperature sensor subsequent to said turning on the power,
    determining an initial interval of time for triggering a temperature sensing of a subsequent temperature based on the derived value representative of the current temperature sensed, wherein initial intervals of time associated with higher values representative of the current temperature sensed are shorter than initial intervals of time associated with lower values representative of the current temperature sensed,
    adjusting the initial interval of time between said triggering the temperature sensing of the current temperature and triggering a temperature sensing of a subsequent temperature based on a comparison of the value representative of the current temperature sensed with the value representative of a previous temperature sensed, wherein the initial interval is reduced when the value representative of the current temperature sensed is higher than the value representative of the previous temperature sensed, and turning off the power to the temperature sensor subsequent to the current temperature being sensed by the temperature sensor.

2. A data processing device as claimed in claim 1, wherein the temperature sensor includes an analogue to digital converter for forming a digital representation of the temperature.

3. A data processing device as claimed in claim 1, comprising a data store storing data defining a model of the rate of decay of the non-volatile memory as a function of temperature, and wherein the processor is configured to form the estimate of the current rate of decay of the non-volatile memory by means of the model.

4. A data processing device as claimed in claim 3, comprising a data store storing data defining models of the rate of decay of a plurality of types of memory as a function of temperature, and wherein the processor is configured to form the estimate of the current rate of decay of the non-volatile memory by means of one of the models that corresponds to the non-volatile memory.

5. A data processing device as claimed in claim 1, wherein the processor is configured to form the estimate of the current rate of decay of the non-volatile memory in dependence on the current temperature sensed by the temperature sensor at no less than a predetermined frequency and to update the accumulated level of decay of the non-volatile memory in dependence on the estimated current rate of decay.

6. A data processing device as claimed in claim 1, wherein the data processing device is capable of performing a communications function that is dependent on the current temperature sensed by the temperature sensor, and wherein the processor is configured to form the estimate of the current rate of decay of the non-volatile memory in dependence on the temperature as sensed for the communications function and to update the accumulated level of decay of the non-volatile memory in dependence on the current rate of decay of the non-volatile memory estimated in dependence on the temperature as sensed for the communications function.

7. A data processing device as claimed in claim 1, wherein a plurality of charge states define the data stored in the non-volatile memory.

8. A data processing device as claimed in claim 1, wherein the non-volatile memory is reprogrammable memory.

9. A data processing device as claimed in claim 1, wherein the device is configured to store the accumulated level of decay of the non-volatile memory.

10. A data processing device as claimed in claim 1, the data processing device being configured to execute a program routine whose function is a function other than memory management, the program routine causing the processing device to store the value representative of the current temperature sensed by the temperature sensor, and to form the estimate of the current rate of decay of the non-volatile memory in dependence on the stored value representative of the current temperature sensed by the temperature sensor.

11. An environmental sensing device comprising:
a data processing device as claimed in claim 1, the data processing device comprising:
a wireless transceiver;
the non-volatile memory;
an environmental sensor for sensing a parameter other than temperature; and
a battery for powering the environmental sensing device.

12. An environmental sensing device as claimed in claim 11, wherein the data processing device, the non-volatile memory and the battery are sealed within a housing.

13. A road-going vehicle comprising a data processing device as claimed in claim 1.

14. A road-going vehicle comprising an environmental sensing device as claimed in claim 11.

15. A method for controlling refreshing of a non-volatile memory, the method comprising the steps of:
triggering a temperature measurement of a current temperature when a state of a clock reaches an adjusted interval of time, the clock being sensitive to temperature;
subsequent to the temperature measurement being triggered, sensing the current temperature with a temperature sensor formed on a substrate on which the non-volatile memory is formed;
forming an estimate of a current rate of decay of the non-volatile memory in dependence on the current temperature sensed by the temperature sensor;
determining an amount of decay based on the estimated current rate of decay and an adjusted interval of time between triggering the temperature sensing of the current temperature and triggering a temperature sensing of a previous temperature;
updating an accumulated level of decay of the non-volatile memory in dependence on the estimated current rate of decay, wherein updating the accumulated level of decay comprises adding the determined amount of decay to a previous accumulated level of decay; and
causing the memory interface to refresh the non-volatile memory by replenishing one or more charge storage devices in the non-volatile memory when the accumulated level of decay exceeds a predetermined threshold,
wherein sensing the current temperature with the temperature sensor comprises:
turning on power to the temperature sensor,
deriving a value representative of the current temperature sensed by the temperature sensor subsequent to turning on the power,
determining an initial interval of time for triggering a temperature sensing of a subsequent temperature based on the derived value representative of the current temperature sensed, wherein initial intervals of time associated with higher values representative of the current temperature sensed are shorter than initial intervals of time associated with lower values representative of the current temperature sensed,
adjusting the initial interval of time between the triggering the temperature measurement of the current temperature and triggering a temperature measurement of a subsequent temperature based on a comparison of the value representative of the current temperature sensed with the value representative of a previous temperature sensed, wherein the initial interval is reduced when the value representative of the current temperature sensed is higher than the value representative of the previous temperature sensed, and turning off the power to the temperature sensor subsequent to the current temperature being sensed by the temperature sensor.

16. A data processing device as claimed in claim 1, wherein the adjusted interval of time varies between a minimum time between temperature readings and a maximum time between temperature readings, and further wherein:
- if the value representative of the current temperature sensed changes by more than a preset threshold from the value representative of the previous temperature sensed, the minimum time between temperature readings is reduced, and
- if the value representative of the current temperature sensed changes by less than the preset threshold from the value representative of the previous temperature sensed, the minimum time between temperature readings is increased.

17. A data processing device as claimed in claim 1, wherein the data processing device is configured to sense the temperature at a time dependent on the processor being active performing other operations that require the processor to be active.

18. A data processing device as claimed in claim 4, wherein the processor is further configured to detect the memory type of the non-volatile memory to identify the model corresponding to the non-volatile memory.

19. A data processing device as claimed in claim 3, wherein the processor is configured to form the estimate of the current rate of decay of the non-volatile memory for the current temperature sensed by the temperature sensor from the model, and update the accumulated level of decay of the non-volatile memory by adding a ratio of the adjusted interval of time between triggering the temperature sensing of the current temperature and triggering the temperature sensing of the previous temperature and the estimated current level of decay.

* * * * *